(12) United States Patent  
Lindseth (10) Patent No.: US 6,728,596 B1  
(45) Date of Patent: Apr. 27, 2004

(54) WAFER PREALIGNER WITH PHASE SENSITIVE DETECTION

(75) Inventor: Dale Lindseth, Hollister, CA (US)

(73) Assignee: Therma-Wave, Inc., Fremont, CA (US)

(*) Notice: Subject to any disclaimer, the term of this patent is extended or adjusted under 35 U.S.C. 154(b) by 65 days.

(21) Appl. No.: 10/268,376

(22) Filed: Oct. 9, 2002

Related U.S. Application Data (60) Provisional application No. 60/333,720, filed on Nov. 28, 2001.

(51) Int. Cl.$^7$ .............................. B65G 47/00; G06F 7/00
(52) U.S. Cl. ........................... 700/213; 700/59; 700/62; 414/779; 414/783; 414/936; 382/151
(58) Field of Search ........................... 700/59, 62, 213; 414/779, 783, 936, 941; 382/151

(56) References Cited

U.S. PATENT DOCUMENTS

| | | | |
|---|---|---|---|
| 4,457,664 A | | 7/1984 | Judell et al. ............... 414/779 |
| 4,880,348 A | * | 11/1989 | Baker et al. ............... 414/783 |
| 5,479,108 A | * | 12/1995 | Cheng ......................... 324/765 |
| 5,504,345 A | * | 4/1996 | Bartunek et al. ......... 250/559.4 |
| 5,513,948 A | * | 5/1996 | Bacchi et al. ............... 414/783 |
| 5,852,413 A | * | 12/1998 | Bacchi et al. ................. 341/13 |
| 5,870,488 A | * | 2/1999 | Rush et al. .................. 382/151 |
| 5,980,195 A | * | 11/1999 | Miyashita .................... 414/783 |
| 6,124,933 A | * | 9/2000 | Mizutani et al. ............ 356/620 |
| 6,162,008 A | * | 12/2000 | Perkins et al. .............. 414/754 |
| 6,164,894 A | * | 12/2000 | Cheng .................... 414/416.03 |
| 6,275,742 B1 | * | 8/2001 | Sagues et al. ............... 700/213 |
| 6,320,609 B1 | * | 11/2001 | Buchanan et al. .......... 348/126 |
| 6,405,101 B1 | * | 6/2002 | Johanson et al. ........... 700/218 |
| 6,445,448 B1 | * | 9/2002 | Melman et al. ............. 356/246 |
| 6,471,464 B1 | * | 10/2002 | Fay et al. .................... 414/783 |
| 6,561,798 B2 | * | 5/2003 | Kuznetsov et al. ......... 432/249 |
| 6,573,993 B2 | * | 6/2003 | Little .......................... 356/401 |
| 6,625,556 B1 | * | 9/2003 | Conboy et al. ............... 702/84 |

* cited by examiner

*Primary Examiner*—Douglas Hess  
(74) *Attorney, Agent, or Firm*—Stallman & Pollock LLP (57) ABSTRACT

The system and method herein provide a prealigner that has reduced sensitivity to distorting ambient light influences in the environment of a prealigner integrated in a metrology apparatus. A modulated signal is produced by a photo detector in response to modulated light that is partially shielded by wafer positioned in a gap between light source and detector. The pulsed signal is bandpass filtered and demodulated whereby only the difference between high- and low-levels of the pulsed signal are recognized. Flickering and DC components related to ambient light and other distorting operational influences are removed from the analysis unrecognized. Demodulation is synchronously accomplished together with a switching of the light source's power supply. For stable voltage levels of the power supply, a current source is buffered during off-intervals for a constant load on the current source. Also a power steering switch samples the buffers voltage level and takes it as switching condition for the next on-interval of the power supply. Preferably a switched capacitor building block is used as synchronizing element. A final analog output signal is prepared for sampling.

10 Claims, 7 Drawing Sheets

WAFER PREALIGNER WITH PHASE SENSITIVE DETECTION

RELATED APPLICATION

The present application claims the benefit of U.S. Provisional Application Serial No. 60/333,720, filed Nov. 28, 2001, titled WAFER PREALIGNER WITH PHASE SENSITIVE DETECTION, which is incorporated herein by reference.

TECHNICAL FIELD

Optical metrology systems provide for inspecting properties of semiconductor wafers, where the wafers are positioned on a movable platform so that different areas on the wafer can be moved into position for inspection. The present invention relates to a prealigner used to determine, and in some cases adjust the position of the wafer on the platform.

BACKGROUND

This invention relates to optical metrology tools of the type described in U.S. Pat. No. 6,278,519 APPARATUS FOR ANALYZING MULTI-LAYER THIN FILM STACKS ON SEMICONDUCTORS which is incorporated herein by reference. These tools are used to analyze the characteristics of semiconductor wafers. Typically, these tools include one or more radiation probe beams which are focused to a small spot on the wafer surface, and include a motion stage for supporting the wafer. Various stage motion combinations are available including full X, Y stages; R/Theta stages; and ½ X-½ Y plus Theta stages. The motions of the stages are computer controlled for moving the wafer into position with respect to the focused spot of the probe beam.

In the past, prior to loading a wafer onto the stage, the wafer was rotated to the desired orientation by a separate pre-aligner. This device would rotate the wafer and center the wafer to find the correct orientation for loading the wafer onto the stage. These pre-aligners were relatively complex and expensive.

Accordingly, the assignee herein developed a pre-aligner that was integrated into its metrology tools. The integrated pre-aligner mechanism is illustrated in FIG. 1.

Figure 1:
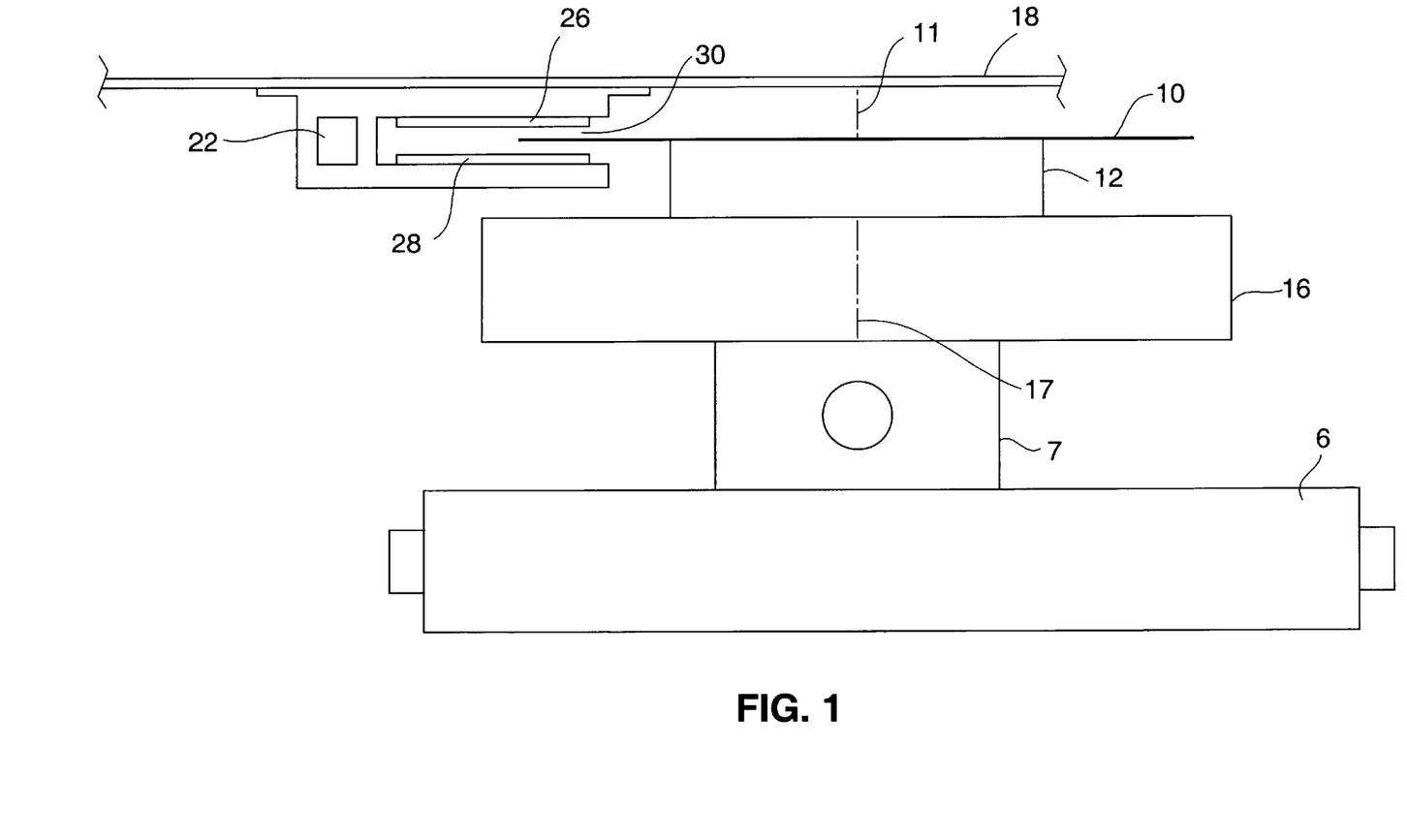
FIG. 1 shows a schematic portion of a metrology tool including a prealigner mechanism and a wafer placed on top of a stage system.

As seen in FIG. 1, the wafer 10 is shown supported on a wafer chuck 12. The wafer chuck 12 sits on a rotating (theta) stage 16. The rotating stage 16 is placed on top of linear stages 6, 7, which can include full or half X-Y, or just a single linear stage. The theta stage 16 has an axis of rotation 17 and the wafer has a center axis 11. The wafer 10 sits below optics plate 18. Optics plate 18 supports optical elements (not shown) for focusing a probe beam of light onto the sample and for collecting the probe beam after reflection. As described in U.S. Pat. No. 6,278,519, measurements can include reflectometry and ellipsometry. The probe beam can be single wavelength or broadband.

Prior to measurement, the wafer 10 must be aligned with the optical elements of the measurement devices (not shown). A pre-aligner mechanism 22 is mounted on the lower surface of the optics plate 18. The mechanism includes a light source 26 in the form of a bar or elongated array of LED. A photodetector 28 is mounted opposite the light source 26. A gap 30 is defined between the light source 26 and the photodetector 28. The edge of the wafer 10 extends within this gap 30.

Figure 2A:
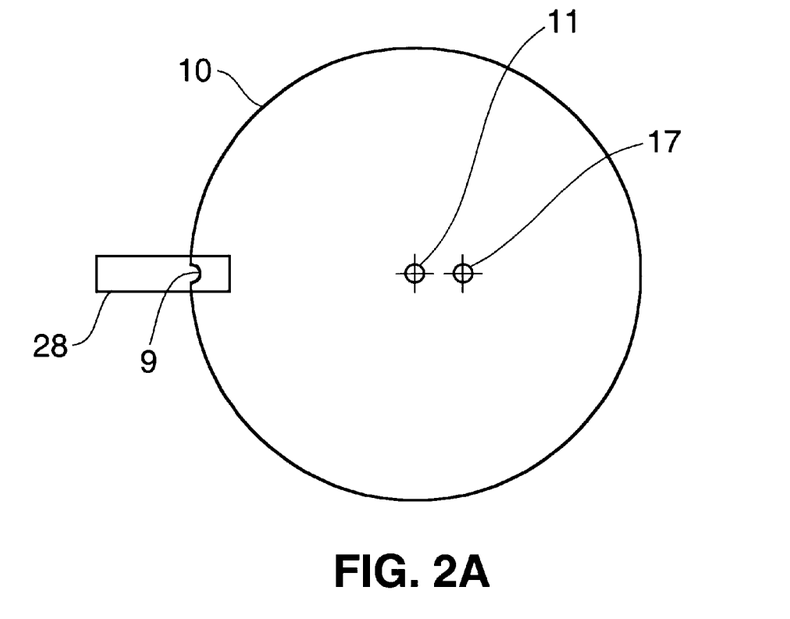
FIGS. 2A, 2B schematically shows positions and orientations of a wafer placed on a stage system.
Figure 2B:
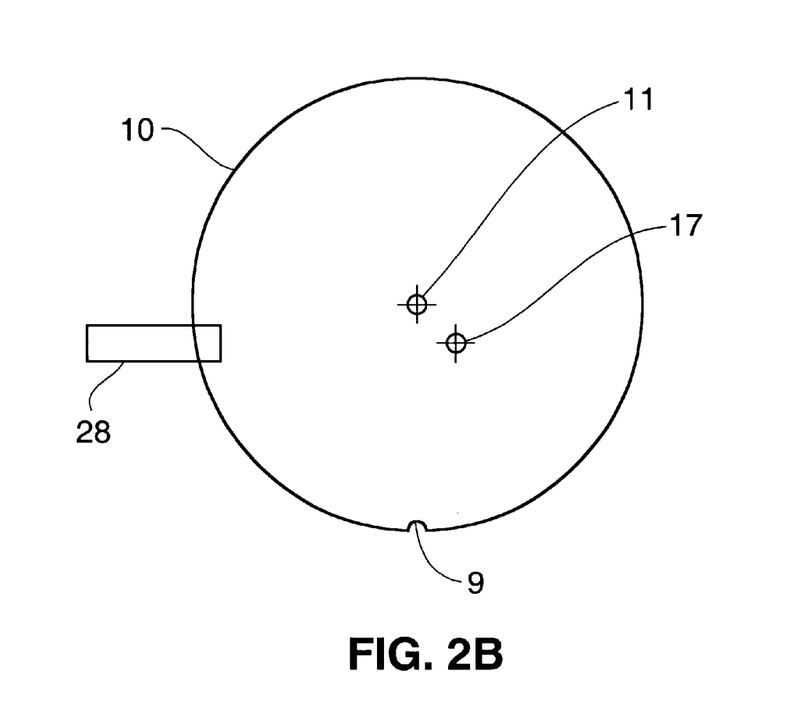

FIGS. 2A and 2B illustrate how the edge of the wafer 10 will overlap a portion of detector 28 when the wafer is in the gap 30. As can be appreciated, if the wafer 10 were loaded on the chuck in a position further left than the position shown in FIGS. 1, 2A and 2B, more of the photodetector would be covered and the voltage generated by the photodetector 28 would be lower. Conversely, if the wafer were loaded on the chuck 12 further to the right than the position shown in FIGS. 1, 2A and 2B, less of the photodetector would be covered and the voltage generated by the photodetector would be larger. This difference in photodetector output voltage corresponds to the position of the wafer can be used to determine the position of the wafer, and to align the position of the wafer.

Figure 3A:
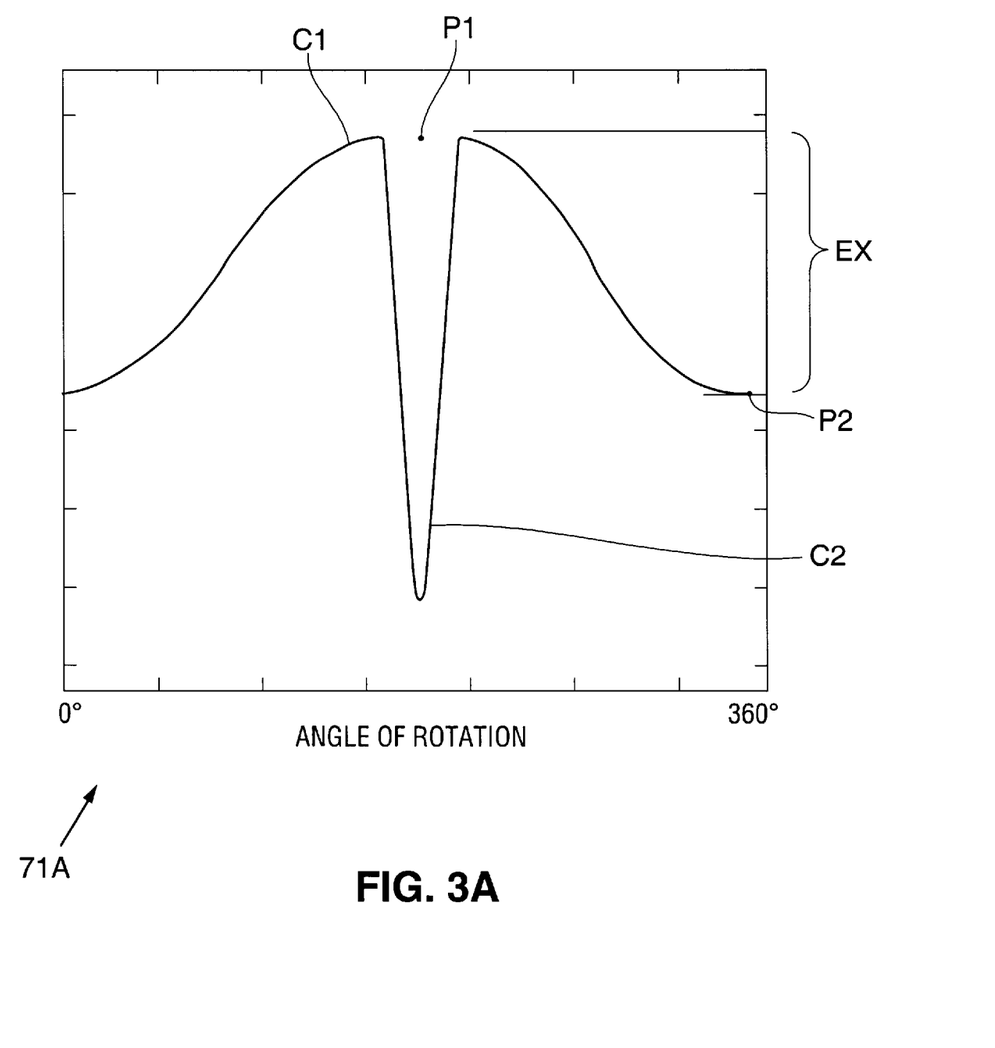
FIGS. 3A, 3B depict exemplary detector output graphs corresponding to wafer offset relative to a rotation axis of the stage system and the wafer's notch orientation.
Figure 3B:
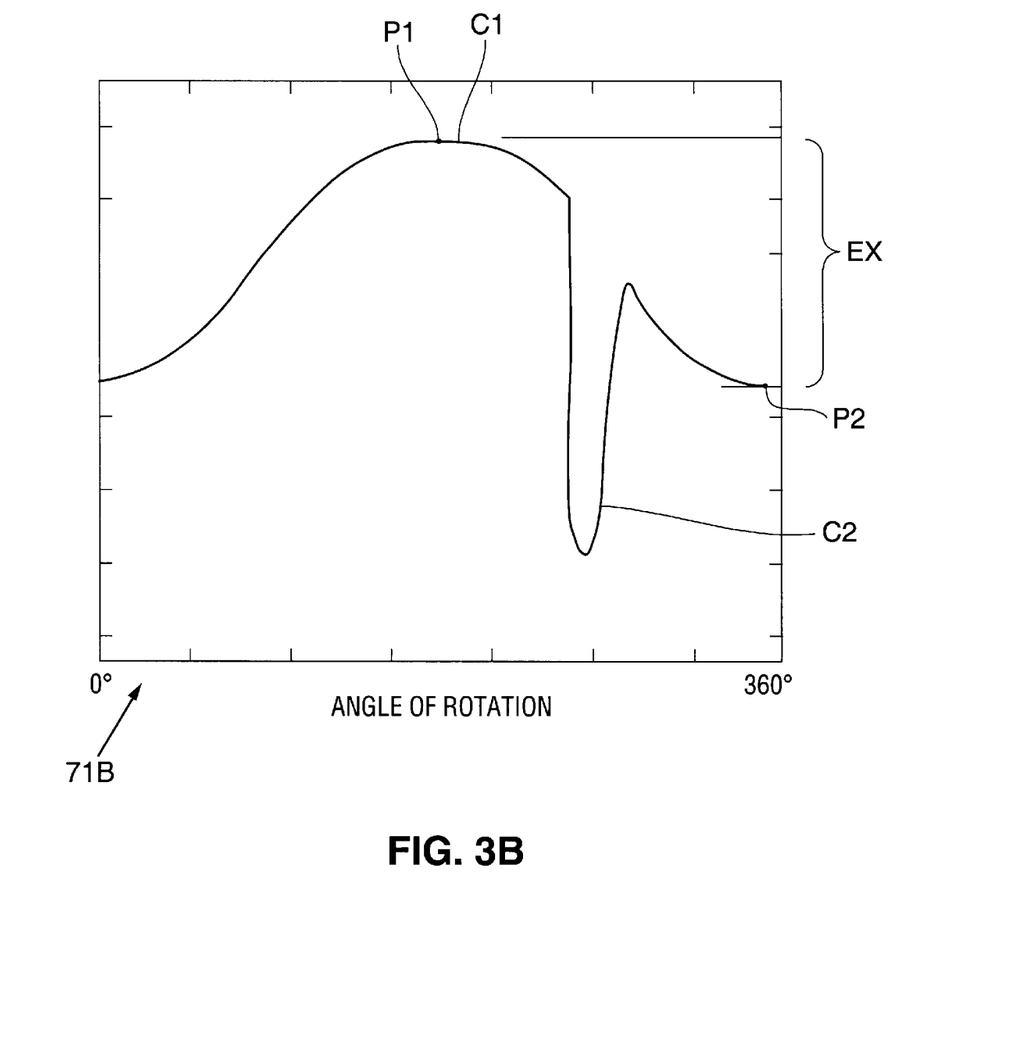

In operation, after a wafer 10 has been placed on the chuck 12, the theta stage 16 is activated to rotate the wafer 10 through 360 degrees. The output of the photodetector 28 is monitored and stored as a function of rotation angle. Examples of the output from the detector as a function of rotation angle are shown in FIGS. 3A, 3B. As seen, there will be some point in the curve where there is a sharp discontinuity C2 in the measurement curve C1. This discontinuity C2 corresponds to the rotation angle when the wafer flat or notch 9 is aligned with the photodetector 28. The stage coordinates can then be determined relative to the flat or notch 9. FIGS. 3A and 3B illustrate that depending on the initial position of the notch 9 relative to the photodetector, the discontinuity will appear at different positions relative to the angle of rotation.

The output of the photodetector 28 can also be used to center the wafer 10. More specifically, if the wafer 10 was perfectly centered, the output voltage from the photodetector would not vary as the wafer was rotated and amplitude EX would be zero. If the wafer 10 is misaligned, the amount which the wafer 10 overlaps the detector 28 will vary as the wafer is rotated creating a sinusoidal variation in the photodetector output as shown in FIGS. 3A and 3B for example. The greater the variation in the sinusoid (from peak to trough (P1 to P2)), the more the wafer 10 is misaligned. By determining the extent of the variation (from peak to trough) and associating that with the wafer's 10 angle of rotation, the amount of the wafer's 10 misalignment can be determined. This information can be used to calculate a linear correction movement of the linear stages 6, 7 in correspondence with the orientation of the theta stage 16 such that the wafer's center axis 11 may be used as reference during operational positioning of the wafer 10.

In the past, the above described pre-aligner has been used successfully in stand alone metrology tools. Some difficulties have arisen when attempting to use this approach with integrated metrology systems, or those measurement systems incorporated into semiconductor fabrication tools. In such systems, it is sometimes difficult to control ambient light falling on the detector. This is particularly true if the distance between the light source and the photodetector is increased as was found to be necessary to accommodate alternate wafer load mechanisms used in an integrated metrology environment. Changes in ambient light can adversely effect the operation of the prior art system. Particularly fluorescent illumination with its well-known flickering characteristic imposes a significant ambient distortion. Since changes in ambient are less controllable, it would be desirable to develop an improved wafer alignment system that could operate where ambient light variations exist.

SUMMARY

The present invention is directed to a system and a method for determining the alignment of a wafer. The invention uses a light source which is modulated, and utilizes synchronous detection of the modulated light generated by the light source. One embodiment of the invention is a system for determining the alignment of a wafer supported by a chuck coupled to a stage capable of rotary motion. This system includes a light source, and a photodetector positioned a distance from the light source, wherein a gap is defined in the distance between photodetector and the light source. The wafer is positioned such that a portion of the wafer is disposed in the gap. The photodetector generates an output in response to light received from the light source. In this system a first circuit is connected to the light source and to the photodetector, and provides modulated power to the light source. The circuit also provides synchronous detection of the output of the photodetector and generates signals based on the output of the photodetector. This system also includes a processor for interpreting the signals generated by the photodector to evaluate the alignment of the wafer.

Another embodiment of the invention includes a method for determining the alignment of a wafer supported by a chuck coupled to a stage capable of rotary motion. This method includes providing a modulated light source, where the light source is modulated at a first frequency, and providing a photodetector which outputs a first signal in response to modulated light generated by the modulated light source and in response to ambient light. This first signal is processed to generate a second signal which corresponds to the modulated light, and the second signal is analyzed to determine the alignment of the wafer.

Another embodiment of the invention includes a method for determining the alignment of a wafer supported by a chuck coupled to a stage capable of rotary motion. This method includes driving a light source with a modulated power supply, whereby a modulated light is emitted into a gap. A photodector outputs a first signal in response to modulated light generated by the light source and an ambient light. This signal is processed to generate a second signal. A wafer is positioned such that a portion of the wafer is disposed in a gap between the light source and the photodetector, and the wafer is rotated. Changes in second signal that result from rotating the wafer are then analyzed to determine the alignment of the wafer.

DETAILED DESCRIPTION OF THE INVENTION

The present invention modulates the light source used in a prealigner, and provides a phase sensitive detection system to demodulate the pulsing output signal provided by the photodetector which is detecting the modulated light generated by the light source. For ease a discussion an embodiment of the invention is discussed in general terms, and then subsequent discussion of an embodiment is provided with reference to detailed figures provided herein. One embodiment provides a power modulation circuit which provides modulated power used to drive a light source. A receiving circuit, and a synchronizing circuit, are also provided. The receiving circuit transforms and demodulates the pulsing signal into a final analog signal suitable for sampling. The synchronizing circuit provides for synchronization of the operation of the power modulation circuit and the receiving circuit.

In an embodiment, the power supply to the light source, (light bar) is chopped (or modulated) at a nominal rate of about 50 KHz with evenly balanced on- and off-intervals also described as a 50% duty cycle. During an on-interval, the photo detector recognizes the light emitted from the light source, to the extent it is not blocked by the wafer disposed in the gap between the light source and the photo detector. Ambient light is also sensed by the photo detector. Thus, some fraction of the output signal from the photo detector is due to the ambient light detected by the photodetector and the remaining fraction is due to the modulated light output by the modulated light source.

For a precise recognition of the wafer's shielding effect, the light source has to emit its light at a constant level during the on-intervals. In the prior art, where the light bar is continuously turned on, keeping the power supply's voltage level constant requires no special effort. In the present invention, however, voltage fluctuations in the current source between the on- and off-intervals and fluctuations resulting from the switching itself needs to be considered. In part, to deal with possible fluctuations, the power modulation circuit includes a buffer that is coupled to the current source during the light bar's off-interval. The buffer provides a constant load for the current source, and consequently reduces fluctuations in the voltage level of the current source. Additionally, a power steering switch samples the voltage level at the buffer and takes the sample as switching condition for the next following on-interval. By doing so, voltage changes during the switching are substantially eliminated from the modulated power supply.

The receiving circuit transforms the signal produced by the photo detector such that only the signal's gain between low- and high-levels contributes to a final analog output signal. The influence of the ambient light is filtered out. The chop rate (modulation rate) should be high enough that any flickering of fluorescent lamps, or other ambient light source can be filtered out by the receiving circuit using signal processing components and methods discussed herein. The signal output by the photo detector is preamplified. This signal is then passed through a band-pass filter to eliminate out-of-band interference frequencies like the flickering of fluorescent lamps. Also the DC component related to constant ambient light is filtered out, which can also provide the additional benefit of eliminating preamplifier 1/f noise, as well as temperature and long-term low frequency drift terms, and fixed offsets due to input offset voltage and current. The bandpass filtered signal then passes through a demodulating lock-in portion of the receiving circuit which is coupled to the synchronizing element where positive and negative phases of the bandpass filtered signal are brought back into the positive regime on separate signal lines. Then using a differential amplifier the separate signals are combined. The combined signal is filtered and transformed into the final analog signal ready for sampling.

For appropriate demodulation to occur there must be adequate synchronization between the power modulation circuit and the receiving circuit. In addition the proper phase relationship must be preserved to result in demodulation of the amplitude of the received signal strength. In one embodiment, a switched capacitor building block is utilized. A common oscillator internal to a switched capacitor chip can control the simultaneous switching of the power modulation circuit and the receiving circuit. This establishes proper synchronization between the two circuits. This switched capacitor building block can be part of a single chip that is commonly used for switched capacitor applications, but in this application the switched capacitor building block is being used as a quadruple pole double throw synchronous analog switch, (driven by a common oscillator). Thus, the overall circuitry can be relatively simple and inexpensive. The final analog output signal represents position fluctuations of the rotating wafer edge and the wafer's notch, and reduces distorting ambient light influences.

A suitable switched capacitor building circuit can be purchased from Linear Technology Corporation, part LTC 1043. This single chip circuit can be used to control both the frequency of modulation of the modulated power supply and the frequency of switching in the lock-in detection of the receiving circuit, thereby providing excellent overall performance and high accuracy for the wafer prealignment system at low cost.

Figure 4A:
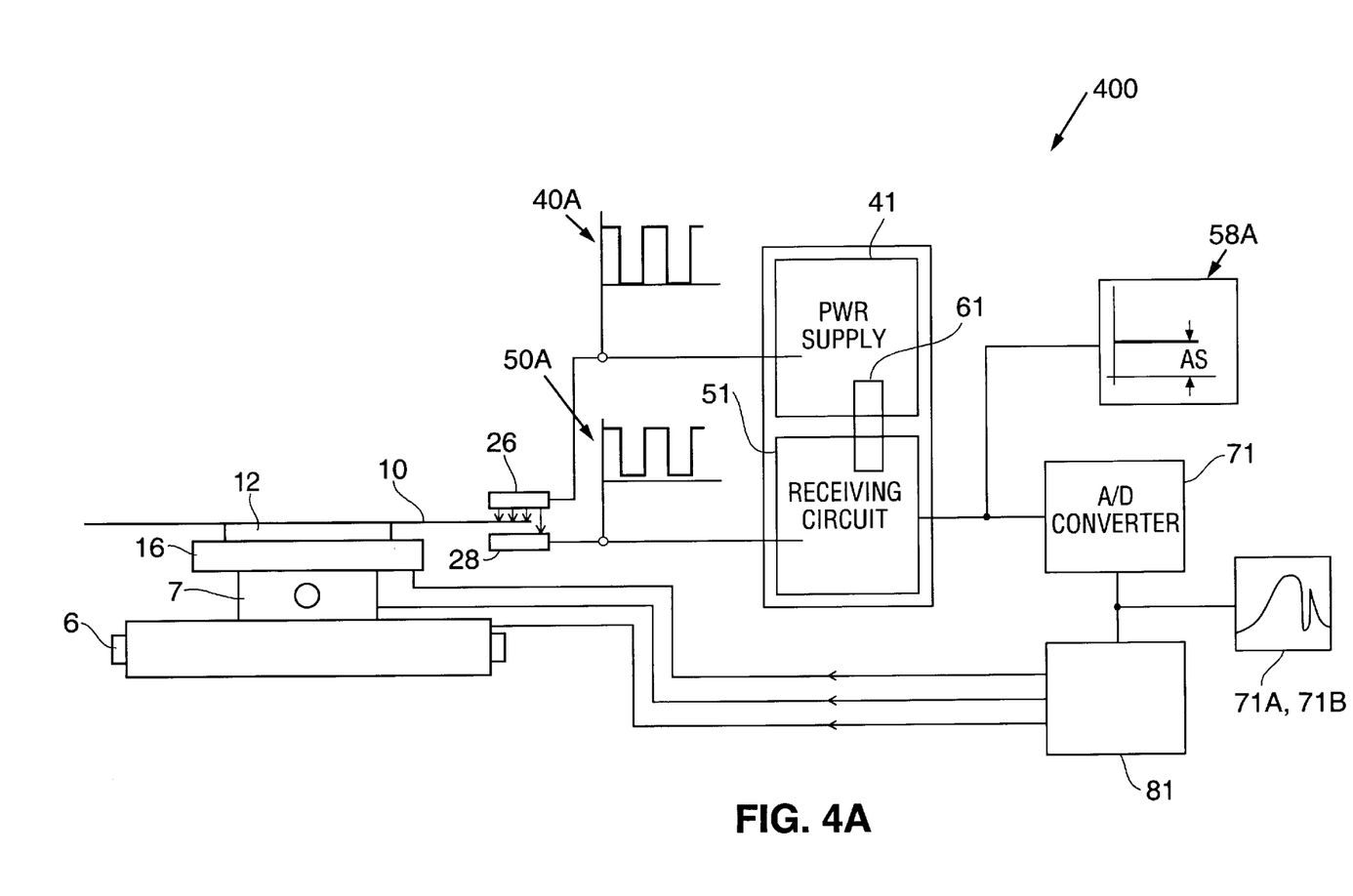
FIGS. 4A, 4B show aspects of a prealigner of the present invention.

FIG. 4A shows an embodiment of the prealigner 400 of the present invention. The prealigner includes a power modulation circuit 41 which generates a modulated power supply voltage shown as graph 40A. The modulated power supply 41 drives the light source 26, which emits a corresponding pulsed light. The light source 26 may be, for example, a light bar or a linear LED array. Opposing the light source 26 is the photo detector 28. The light source 26 and photo detector 28 are positioned within a metrology apparatus such that a wafer 10 supported by the chuck 12 partially shields the emitted light from the photo detector 28. The power supply is modulated or chopped at a frequency of typically about 50 kHz with a 50% duty cycle.

The pulsed light of the light source 26 is received by the detector 28 and transformed into a pulsed signal illustrated by the graph 50A. When the light source 26 is on (i.e. when the modulated power supply is outputting a high voltage to drive the light source) the detector 28 outputs at high-level, which corresponds to the light received from the light source 26 plus ambient light. Whereas, when the modulated power supply driving the light source is at low voltage (e.g. zero 0 volts), the pulsed signal 50A has a low level, which corresponds to ambient light received by the detector 28. The frequency of the pulsed signal is synchronized with the modulated power supply 41. The modulation frequency is selected so that it is a much higher frequency than the flickering frequencies of the ambient light. In the case of fluorescent lamps the flickering frequency of the ambient light may be between about 50 and 180 Hz. Thus, for a modulation frequency of 50 KHz, the ratio of the modulation frequency relative to the to the flickering frequency of the ambient light has a ratio between about 277 and 1000.

The receiving circuit 51 demodulates the pulsed signal 50A from the detector 28 and transforms it into an analog signal illustrated by the graph 58A. The analog signal 58A is a DC signal with voltage level variance AS that correspond to the wafer edge movement in the gap 30 between light source 26 and the detector 28. The correct proportion between voltage variance and wafer edge movement is determined in an initial calibration process. The analog signal 58A is sampled by a well-known Analog to Digital (A/D) converter 71 while the wafer 10 is rotated by the theta stage 16. The sample rate can be, for example, in the range of 1000 to 2000 samples per second, which means a down converting of the initial modulation frequency to 1–2 kHz nominal. Thus, the modulation frequency has a second ratio of about 50 to 25 relative to the sample rate. The sample frequency is determined by the speed of the converter 71 and/or the processor 81. The modulation frequency can be limited by the impedances and capacitive properties of the involved components.

It should be noted that in general the higher the ratio of the modulation frequency relative to the frequency of the ambient light flickering the more benefit is accrued from the band pass filtering. Further, the higher the ratio of the modulation frequency relative to the sampling frequency, the more accurate the sampling.

Figure 4B:
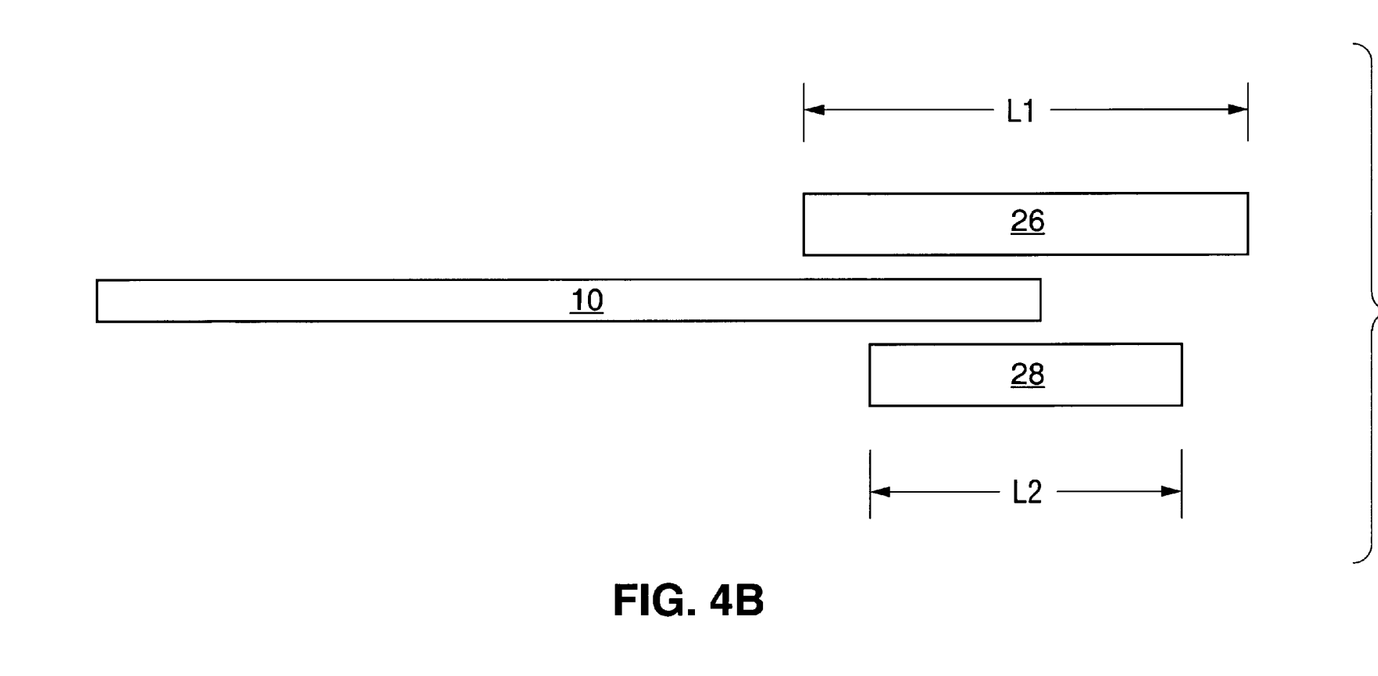

The length L1 (see FIG. 4B) of the modulated light source 26 can be about 40 mm and the length L2 (see FIG. 4B) of the detector 28 about 19 mm with the sensor preferably centered under the length of the light source 26. In cases where a well-known pinlifter assembly places the wafer 10 on a chuck 12 after receiving the wafer 10 from a robot arm, the initial centering prior to prealigner operation may be, +/−0.5 mm. The required centering accuracy of the prealigner system may be +/−0.015 mm. This means for the exemplarily stated dimensions of the light source 26 and the detector 28 that fluctuations of less then 0.1% of the light received by the detector 28 must be properly interpreted by the prealigner system. At the same time the system has to have a measurement bandwidth sufficiently high to recognize wafer edge movements of up to 1 mm. In cases, where the wafer 10 is placed directly on the chuck 12 the prealigner system recognizes wafer edge movements of up to 6 mm.

During the prealignment operation, when the wafer is rotated once around 360 degrees which takes approximately 1 to 4 seconds, the converter 71 samples the final analog output signal. This data is represented by the plots 71A and 71B. The plots 71A and 71B correspond to the graphs of FIGS. 3A and 3B. A processor 81 interprets the digital information in a well-known fashion for centering and positioning of the wafer 10. Based on the data used to generate the graph 71A the processor sends signals to the linear stages 7 and 6, which causes the drives to move the chuck 12 and theta stage 16 which results in the repositioning, or aligning, the wafer positioned on the chuck 12, relative to the measurement devices (such as reflectometers, or elipsometers) of the metrology system. Measurements may then be performed at predetermined locations of the wafer 10.

To determine the correlation of the voltage fluctuations of the analog signal 58A relative to the position of the edge of the wafer, the prealigner system is preferably calibrated prior to operation. Calibration is achieved by moving the wafer 10 via the linear stages 6 and/or 7 such that it is substantially centered and the wafer edge covers a portion of the photodetector 28. Next, the processor 81 sends signals to the linear drive 6 to cause it to move the chuck 12 and thereby the wafer 10 a known radial distance. The voltage variation in the analog output 58a is then sampled and recorded as a function of distance. This variation is stored and used during subsequent operation to translate a change in analog signal 58A to a radial position of the edge of the wafer 10. In one embodiment, any non-linearity in the calibration data is addressed by subjecting the data to a linear regression analysis. For improved accuracy, the non-linear effects of non-uniform distribution of light and the like may be taken into account by a more elaborate curve fitting algorithm as is known in the art.

A synchronizing element 61 controls the modulation of the power supply and demodulation of the pulsed signal. In one embodiment, the synchronizing element 61 is a single switched capacitor instrumentation building block, with a built-in oscillator, the frequency of which is controllable by a single capacitor. This adaptation of the instrumentation building block can reduce the overall circuit complexity. The switched capacitor building block provides two pairs of alternately and synchronously switched lines. One pair is utilized in the power modulation circuit 41, the other pair is utilized in the receiving circuit 51. The switched capacitor building block should provide high signal separation, which is important for an accurate system operation.

Figure 5:
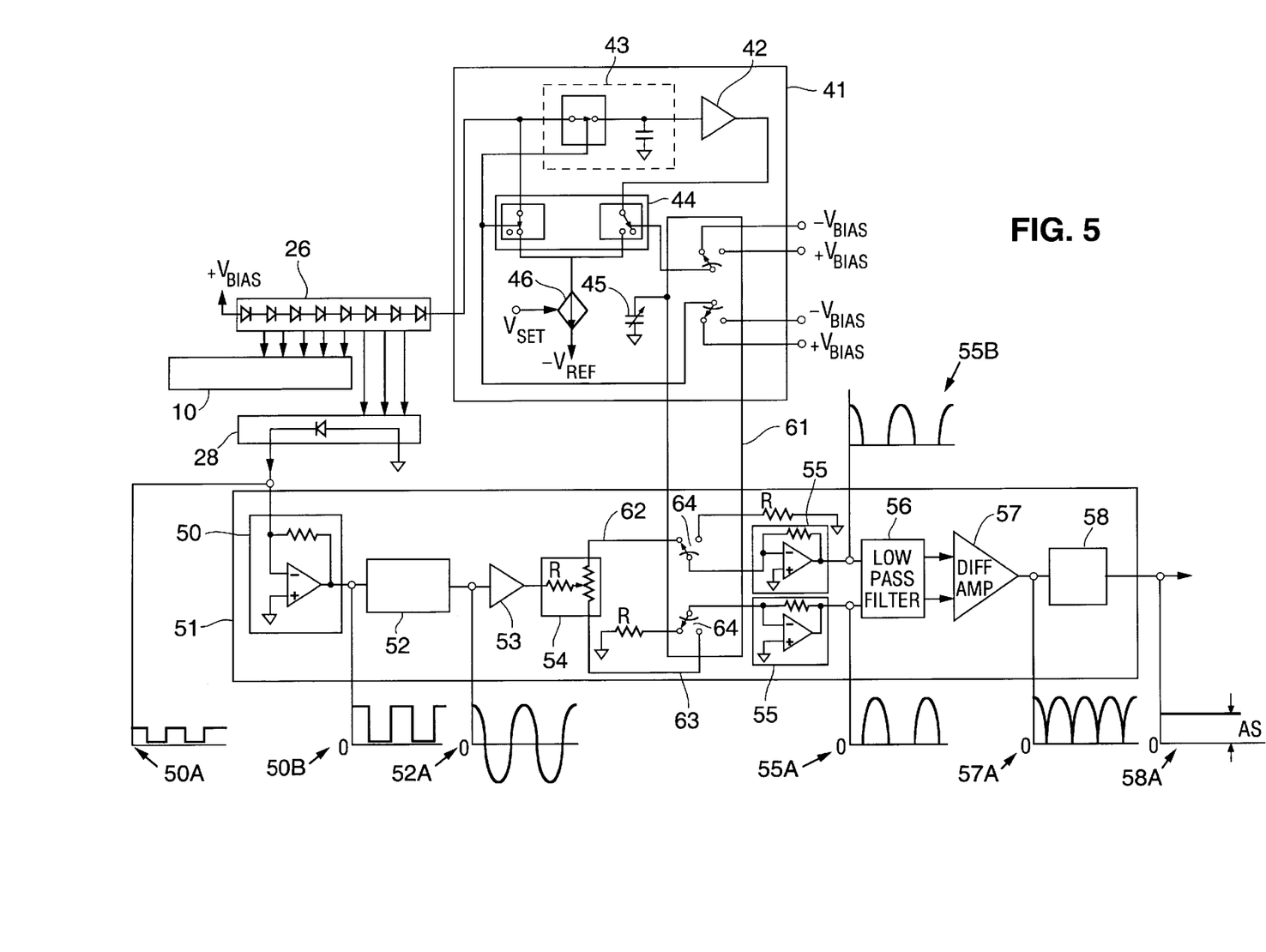
FIG. 5 illustrates an exemplary circuit diagram for a prealigner of the present invention, with graphs at selected points of the signal lines in the circuit.

FIG. 5 shows additional detail regarding a method and system of the present invention. As shown in FIG. 5, the power modulation circuit 41 drives the switching of the light source 26. The power modulation circuit includes adjustable current source 46. The adjustable current source 46 sets the average light level of the modulated power supply. The current source 46 can be adjusted to achieve the desired signal strength output by the light source 26 and received by the detector 28 when the wafer 10 is not present. A current modulating steering switch 44 is used to steer the current generated by the current source 46, such that the current is alternately directed between the light bar 26, and a buffer 42.

The buffer 42 has two functions. It provides a constant load for the current source, so that when the current is not being directed to the light source, the current source will still see a similar load, and thus allow for stable operation of the current source, which results in stable current flow during the operation of the modulated power supply circuit 41. As a result, the voltage level of the current source 46 remains substantially unaffected by the on and off switching of the light source 26. Secondly, the buffer 42 serves as an alternate signal source to be sampled by the modulating steering switch 44. The sampled voltage level of the buffer 42 is taken by the sample and hold amplifier 43 as switching condition of the modulated power supply's on-intervals. In this fashion, short term voltage instabilities in the modulating steering switch 44 resulting from their unavoidable degrading capacitive properties are substantially eliminated during the switching. The modulated power supply 41 has on-intervals with a constant voltage level up to frequencies where the modulator's 44 voltage instabilities would otherwise render the pulsed power supply useless for the described application. The switches of modulator 44 are actuated by the first pair of alternately switched voltages provided by the synchronizing element 61. The modulator 44 is used in cases where a maximum current flow of element 61 is below the current flow necessary for operating the light source 26.

An oscillator (not shown) provides the modulation frequency. In one embodiment, the element 61 has an integrated oscillator. The oscillator is tuned by a variable capacitor 45.

The pulsed signal 50A generated by the detector 28 has a substantially square waveform. It has high levels and low levels. The high levels correspond to the light received from the light source 26 plus ambient light. The low levels correspond to the ambient light impinging the detector 28 while the light source 26 is in its off-interval. The pulsed signal from the photodetector can be relatively weak and unsuitable for transformation. Therefore, a preamplifier 50 amplifies the pulsed signal as shown by the graph 50B. Then, the signal passes through a band pass filter 52, where the high- and low-levels are evenly transformed into positive and negative sinusoidal equivalents, whereby substantially only the gain between low- and high-levels contributes to the amplitudes of the positive and negative signal phases. Flickering and DC components related to ambient light are largely eliminated by the band pass filter 52. In a following step, the signal is again amplified by an amplifier 53, in part to compensate for losses during the band pass filtering. A balance resistor 54 splits the signal output by the amplifier 53 onto two lines 62 and 63 that are coupled with the synchronizing circuit 61, which includes the switched capacitor instrumentation building block. The balance resistor 54 is adjusted to compensate for differing resistances in the two separate signal paths.

Since the signals on lines 62 and 63 are still synchronous with the modulated power supply 41, the phase separation is easily accomplished utilizing the second half of the element 61 by alternately switching both lines synchronous to the switching of the modulator 44. After passing through the element 61, the two separated signals 62 and 63 are independently amplified by instrumentation amplifiers 55. Each of the resulting signals carry equally poled phases that are offset to each other and have periods that correspond to the modulated power supply's 41 duty cycle. The graphs 55A and 55B illustrate the two separated signals. A low pass filter 56 filters out signal noise induced by the element 61 and the instrumentation amplifiers 55. In the following differential amplifier 57, the two separated signals are combined again as shown in graph 57A. A final filter 58 smoothes the signal to a constant level AS that is in proportion to the amplitude of the signal from the photodetector 28. The final analog signal is then sampled. The well-known lock-in method of detection applied by the receiving circuit 51 averages any out-of-band interfering light, such as stray ambient light, to zero such that they do not influence the final analog signal, and the final analog output signal 58A corresponds to the light output by the light source 26.

The demodulator switches 64 are located at a virtual ground point of the amplifiers 55. This means that the voltage applied to the switches are essentially zero, and independent of the amplitude of the received signal being demodulated. This method of detection allows for fast switching and low error contributions due to switch feedthrough. It also results in constant charge transfer errors, and constant switch on resistance. Two balanced switches are used as opposed to a single switch. This balances out charge transfer errors. The switches are double pole, double throw, which has the additional advantage of balancing the impedance levels seen by the instrumentation amplifier. As discussed above a suitable switched capacitor building block can be purchased from Linear Technology Corporation, part LTC 1043.

The final analog output 58A from the receiving circuit 51 is sampled while the wafer 10 is rotated. The sampled signal is recorded as a function of rotation angle. The resulting plot 71A is shown in FIG. 4A. The wafer notch or flat 9 corresponds to the discontinuity C2 while the peak and trough values P1 and P2 with their rotation angles (see FIGS. 3A, 3B) are used for positioning the wafer.

One example of a possible alternate embodiment, includes a second light source which is switched alternately to the first light source 26. The second light source replaces the buffer 42. Both light sources have a separate and distinct light spectrums. Each of two photo detectors has a distinct response to only one of the two light sources. Elements 50, 52, 53 can be provided for both pulsed signals separately propagating towards element 61.

The present invention can provide that the method of edge detection is transmissive (as opposed to reflective). The advantage of this approach is that the detection method is not prone to errors as a result of sample wafer reflectivity variations. The photodetector used in the present invention can be a low-cost silicon photoconductive cell, which is essentially a large area photodiode. The light source can be a low cost visible light bar which can be a diode or LED. An infrared source could also be used. The subject method of detection can be relatively low in cost compared to other methods of detection which use CCD, and/or scanned linear photo-diode arrays, and which typically require a stand-alone (off-line) pre-aligner, followed by wafer load operation into the metrology module.

While the method and apparatus of the present invention has been described in terms of its presently preferred and alternate embodiments, those skilled in the art will recognize that the present invention may be practiced with modification and alteration within the spirit and scope of the appended claims. The specifications and drawings are, accordingly, to be regarded in an illustrative rather than a restrictive sense. Further, even though only certain embodiments have been described in detail, those having ordinary skill in the art will certainly understand that many modifications are possible without departing from the teachings thereof. All such modifications are intended to be encompassed within the claims set forth below.

What is claimed is:

1. A system for determining the alignment of a wafer supported by a chuck coupled to a stage capable of rotary motion, said system comprising;
   a light source;
   a photodetector positioned a distance from the light source, wherein a gap is defined in the distance between photodetector and the light source, wherein a portion of the wafer is disposed in the gap, and wherein the photodetector generates an output in response to light received from the light source;
   a first circuit connected to the light source and to the photodetector, said first circuit providing modulated power to the light source, said first circuit also providing synchronous detection of the output of the photodetector and generating signals based on the output of the photodetector; and
   a processor for interpreting the signals to evaluate the alignment of the wafer.

2. The system of claim 1 wherein the first circuit includes:
   a modulated power supply coupled to the light source;
   a receiving circuit coupled to the photodetector; and
   a synchronizing circuit coupled to the modulated power supply and the receiving circuit.

3. The system of claim 2 wherein the modulated power supply provides a modulated driving current to the light source, such that the light source is switched on and off at a first frequency.

4. The system of claim 3 wherein the first frequency is substantially greater than a frequency at which a fluorescent light flickers.

5. The system of claim 2 wherein the modulated power supply includes:
   a modulator coupled to the synchronizing circuit;
   a buffer circuit;
   a current steering circuit coupled to the synchronizing circuit;
   wherein in response to signals from the synchronizing circuit the modulator and current steering circuit alternately direct current to the light source, and to the buffer.

6. The system of claim 1 wherein the stage includes a linear drive, and the processor controls the position of the linear drive based on the signals generated by the circuit.

7. A method for determining the alignment of a wafer supported by a chuck coupled to a stage capable of rotary motion, said method comprising:
   providing a modulated light source, wherein the light source is modulated at a first frequency;
   providing a photodetector which outputs a first signal in response to modulated light generated by the modulated light source and in response to ambient light;
   processing the first signal to generate a second signal which corresponds to the modulated light; and
   analyzing the second signal to determine the alignment of the wafer.

8. The method of claim 7 wherein the processing of the first signals includes transmitting the first signal through a band pass filter.

9. The method of claim 7 wherein the processing of the first signals includes:
   transmitting the first signal through a band pass filter;
   splitting the first signal into a third signal and a fourth signal;
   alternately inputting the third signal and the fourth signal into a combining circuit, wherein an input to the combining circuit is switched between the third and fourth signal at the first frequency; and
   combining the third signal and the fourth signal to create the second signal.

10. A method for determining the alignment of a wafer supported by a chuck coupled to a stage capable of rotary motion, said method comprising:
    providing a light source;
    driving the light source with a modulated power supply, whereby a modulated light is emitted into a gap;
    providing a photodetector such that the gap is between the photodetector and the light source, wherein the photodetector outputs a first signal in response to modulated light generated by the light source and an ambient light;
    processing the first signal to generate a second signal which corresponds to the modulated light;
    positioning the wafer such that a portion of the wafer is disposed in the gap between the light source and the photodetector;
    rotating the wafer; and
    analyzing changes in the second signal which result from rotating the wafer, and based on this analysis determining the alignment of the wafer.

* * * * *